(12) United States Patent
He et al.

US010311994B2

(10) Patent No.: US 10,311,994 B2
(45) Date of Patent: Jun. 4, 2019

(54) QUANTUM DOT INK

(71) Applicant: BOE TECHNOLOGY GROUP CO., LTD., Beijing (CN)

(72) Inventors: Xiaolong He, Beijing (CN); Qi Yao, Beijing (CN); Seongyeol Yoo, Beijing (CN); Shi Shu, Beijing (CN); Zhanfeng Cao, Beijing (CN); Wei Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 15/118,234

(22) PCT Filed: Dec. 29, 2015

(86) PCT No.: PCT/CN2015/099337
§ 371 (c)(1),
(2) Date: Aug. 11, 2016

(87) PCT Pub. No.: WO2017/012275
PCT Pub. Date: Jan. 26, 2017

(65) Prior Publication Data
US 2017/0174921 A1   Jun. 22, 2017

(30) Foreign Application Priority Data

Jul. 21, 2015 (CN) .......................... 2015 1 0431537

(51) Int. Cl.
| | | |
|---|---|---|
| *H01B 1/20* | (2006.01) | |
| *C09D 11/322* | (2014.01) | |
| *C09D 11/36* | (2014.01) | |
| *C09D 11/38* | (2014.01) | |
| *C09D 11/50* | (2014.01) | |
| *C09D 11/52* | (2014.01) | |
| *C09K 11/02* | (2006.01) | |

(Continued)

(52) U.S. Cl.
CPC .............. *H01B 1/20* (2013.01); *C09D 11/322* (2013.01); *C09D 11/36* (2013.01); *C09D 11/38* (2013.01); *C09D 11/50* (2013.01); *C09D 11/52* (2013.01); *C09K 11/025* (2013.01); *C09K 11/70* (2013.01); *C09K 11/7492* (2013.01); *C09K 11/876* (2013.01); *C09K 11/883* (2013.01); *H01L 51/0005* (2013.01); *H01L 51/006* (2013.01); *H01L 51/007* (2013.01); *H01L 51/0052* (2013.01); *H01L 51/0061* (2013.01); *H01L 51/0067* (2013.01); *H01L 51/0069* (2013.01); *H01L 51/0072* (2013.01); *H01L 51/56* (2013.01); *H01L 51/502* (2013.01); *H01L 51/5056* (2013.01); *H01L 51/5072* (2013.01); *H01L 2051/0063* (2013.01)

(58) Field of Classification Search
CPC ... H01B 1/06; H01B 1/08; H01B 1/12; H01B 1/121; H01B 1/20; H01B 1/22; H01B 1/24; C09D 11/50; C09D 11/52; C09D 11/36; C09D 11/38; H01L 51/0002; H01L 51/0003; H01L 51/0004; H01L 51/0005; H01L 51/0052; H01L 51/006; H01L 51/0061; H01L 51/0062; H01L 51/0065; H01L 51/0067; H01L 51/0068; H01L 51/0069; H01L 51/007; H01L 51/0071; H01L 51/0072; H01L 51/0074; H01L 51/502; H01L 51/5056; H01L 51/506; H01L 51/5064; H01L 51/50068; H01L 51/5072; H01L 51/508; H01L 51/5084; H01L 51/5088; H01L 2051/0063; H05K 1/092; H05K 1/095; H05K 1/097; C09K 11/025; C09K 11/70; C09K 11/883; C09K 11/7492; C09K 11/786
See application file for complete search history.

(56) References Cited

U.S. PATENT DOCUMENTS 7,332,211 B1 * 2/2008 Bulovic ................ B22F 1/0018
                                                                    428/206
8,043,793 B2    10/2011 Iizumi et al.
(Continued)

FOREIGN PATENT DOCUMENTS

| CN | 101810054 A | 8/2010 |
|---|---|---|
| CN | 101878535 A | 11/2010 |
| CN | 102047098 A | 5/2011 |
| CN | 102648536 A | 8/2012 |
| CN | 102668143 A | 9/2012 |
| CN | 105153807 A | 12/2015 |
| CN | 105161635 A | 12/2015 |

OTHER PUBLICATIONS

International Search Report and Written Opinion both dated Apr. 20, 2016; PCT/CN2015099337.
First Chinese Office Action dated Apr. 21, 2016; Appln. No. 201510431537.8.

*Primary Examiner* — Mark Kopec
*Assistant Examiner* — Matthew R Diaz
(74) *Attorney, Agent, or Firm* — Ladas & Parry LLP

(57) ABSTRACT

A quantum dot ink, a manufacturing method thereof and a quantum dot light emitting diode device are provided. The quantum dot ink includes a non-polar organic solvent, a surface tension modifier and a hydrophobic quantum dot, the quantum dot ink further includes a carrier transport material, wherein phase separation is present between the hydrophobic quantum dot and the carrier transport material. After completing ink-jet printing the quantum dot ink, phase separation occurs between the hydrophobic quantum dot and the carrier transport material. Thus, the two-layer structure of a hydrophobic quantum dot layer and a carrier transport material layer is formed through one process. Not only a quantum dot light emitting device is manufactured by the method of ink-jet printing, but also the operation is simplified, and the manufacturing cost of the quantum dot light emitting device is reduced.

16 Claims, 2 Drawing Sheets

(51) Int. Cl.
*C09K 11/70* (2006.01)
*C09K 11/74* (2006.01)
*C09K 11/87* (2006.01)
*C09K 11/88* (2006.01)
*H01L 51/00* (2006.01)
*H01L 51/50* (2006.01)
*H01L 51/56* (2006.01)

(56) References Cited

U.S. PATENT DOCUMENTS

| | | | |
|---|---|---|---|
| 8,247,795 B2* | 8/2012 | Jun | B82Y 30/00 257/17 |
| 8,535,758 B2 | 9/2013 | Bulovic et al. | |
| 8,609,245 B2* | 12/2013 | Jang | C09K 11/025 428/402 |
| 8,771,556 B2* | 7/2014 | Kim | B82Y 30/00 252/519.5 |
| 2006/0159838 A1* | 7/2006 | Kowalski | B82Y 30/00 427/58 |
| 2008/0257201 A1 | 10/2008 | Harris et al. | |
| 2009/0239074 A1* | 9/2009 | Jang | B82Y 20/00 428/402 |
| 2009/0286338 A1 | 11/2009 | Co-Sullivan et al. | |
| 2009/0314991 A1 | 12/2009 | Cho et al. | |
| 2010/0224856 A1 | 9/2010 | Iizumi et al. | |
| 2010/0258789 A1* | 10/2010 | Akai | C09K 11/025 257/40 |
| 2010/0264371 A1 | 10/2010 | Nick | |
| 2010/0264375 A1 | 10/2010 | Nick | |
| 2011/0068321 A1 | 3/2011 | Pickett et al. | |
| 2011/0068322 A1 | 3/2011 | Pickett et al. | |
| 2011/0101387 A1* | 5/2011 | Kinomoto | C09K 11/62 257/89 |
| 2011/0140075 A1 | 6/2011 | Zhou et al. | |

* cited by examiner

QUANTUM DOT INK

TECHNICAL FIELD

Embodiments of the present disclosure relate to a quantum dot ink.

BACKGROUND

A quantum dot light emitting diode display (QLED) is a new display technology based on organic light emitting displays. Different from other types of organic light emitting diodes, its electroluminescent structure is a quantum dot layer, and its principle is that electrons are injected into the quantum dot layer through an electron transport layer, holes are injected into the quantum dot layer through a hole transport layer, wherein these electrons and holes are recombined to emit light in the quantum dots. Compared with organic light emitting diode display devices, QLED has the advantages of narrow emission peak, high color saturation, and wide color gamut.

At present, there are some technical problems in the pixellation and full color display of QLED. The solutions include the methods of ink-jet printing, transfer printing, and micro contact printing. In the case of ink-jet printing method, the major difficulty lies in the fabricating of the quantum dot ink. Generally, the quantum dot ink is generally obtained by dispersing a quantum dot in an organic solvent. As the quantum dot is a nano particle, it is difficult to obtain a quantum dot ink with high viscosity, which leads to the difficulty in printing.

SUMMARY

Embodiments of the present disclosure provide a quantum dot ink, which includes a non-polar organic solvent, a surface tension modifier and a hydrophobic quantum dot, the quantum dot ink further includes a carrier transport material, wherein phase separation is present between the hydrophobic quantum dot and the carrier transport material.

In an embodiment of the present disclosure, the viscosity of the quantum dot ink is from 10 cP to 12 cP, and the surface tension of the quantum dot ink is from 32 dynes/cm to 42 dynes/cm.

In an embodiment of the present disclosure, the surface tension modifier is a hydrophobic and polar organic compound with a relative molecular mass less than 500.

In an embodiment of the present disclosure, the carrier transport material is an electron transport material or a hole transport material with a relative molecular mass less than 500.

In an embodiment of the present disclosure, the non-polar organic solvent is a liquid at 25° C., and the boiling point is less than 200° C. under normal pressure.

In an embodiment of the present disclosure, a mass percentages of each component in the quantum dot ink is: carrier transport material 5%-15%, surface tension modifier 1%-5%, hydrophobic quantum dot 2%-20%, and non-polar organic solvent 60%-92%.

In an embodiment of the present disclosure, a material of the hydrophobic quantum dot is selected from one or more from the group consisting of: CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe and AlSb.

In an embodiment of the present disclosure, the carrier transport material is an electron transport material, and the electron transport material is selected from the group consisting of: Oxadiazole, Thiadiazole, S-Triazole, Naphthaline, Benzoquinone, Carbazole, derivatives of the above substances and combinations thereof.

In an embodiment of the present disclosure, the carrier transport material is a hole transport material, and the hole transport material is selected from the group consisting of: CBP (4,4'-Bis(N-carbazolyl)-1,1'-biphenyl), a-NPD (N'-diphenyl-N,N'-bis(1-naphthyl)-(1,1'-biphenyl)-4,4"-diamine), TCCA (4,4',4"-Tris(N-pyrazolyl)-triphenylamine), DNTPD (N,N'-bis(4-(N,N'-biphenyl-amide) phenyl)-N,N'-Diphenylbenzidine) and combinations thereof.

In an embodiment of the present disclosure, the surface tension modifier is an organic acid, an organic ammonia or a mixture thereof.

In an embodiment of the present disclosure, the organic acid is a fatty acid, and the organic ammonia is an alkyl ammonia.

In an embodiment of the present disclosure, the fatty acid is selected from the group consisting of: octanoic acid, decanoic acid, oleic acid, lauric acid and combinations thereof.

In an embodiment of the present disclosure, the alkyl ammonia is selected from the group consisting of: laurylamine, hexadecylamine, octadecylamine, oleylamine and combinations thereof.

In an embodiment of the present disclosure, the non-polar organic solvent is selected from the group consisting of: chain alkanes, cycloalkanes, halogenated hydrocarbon, aromatic hydrocarbon, derivatives of these substances and combinations thereof.

In an embodiment of the present disclosure, the non-polar organic solvent is selected from the group consisting of: n-pentane, n-hexane, n-heptane, n-octane, cyclopentane, cyclohexane, chloroform, ethyl bromide, carbon tetrachloride, benzene, toluene and combinations thereof.

In an embodiment of the present disclosure, the mass percentage of each component in the quantum dot ink is: carrier transport material 8%-12%, surface tension modifier 1%-5%, hydrophobic quantum dot 5%-18%, non-polar organic solvent 66%-86%.

In an embodiment of the present disclosure, the mass percentage of each component in the quantum dot ink is: carrier transport material 9%-11%, surface tension modifier 1%-2%, hydrophobic quantum dot 10%15%, non-polar organic solvent 62%-80%.

In an embodiment of the present disclosure, the surface of the hydrophobic quantum dot has a trioctylphosphine ligand or a trioctylphosphine oxide ligand.

Embodiments of the present disclosure further provide a fabricating method of the quantum dot ink, and the method includes: mixing a hydrophobic quantum dot, a carrier transport material, a surface tension modifier and a non-polar organic solvent to obtain a quantum dot ink, wherein a proportion of each component is adjusted to allow phase separation to happen between the hydrophobic quantum dot and the carrier transport material.

In an embodiment of the present disclosure, the viscosity of the quantum dot ink is from 10 cP to 12 cP, and the surface tension of the quantum dot ink is from 32 dynes/cm to 42 dynes/cm.

In an embodiment of the present disclosure, an operation of mixing comprises stirring, oscillation or ultrasonic dispersion.

Embodiments of the present disclosure further provide a method for fabricating a quantum dot light emitting diode device, and the method comprising:

1) manufacturing a first electrode layer on a substrate;

2) manufacturing a first function layer on the first electrode layer,
3) printing the quantum dot ink on the first functional layer;
4) allowing phase separation to occur in the quantum dot ink to form a hydrophobic quantum dot layer and a second function layer, manufacturing a third function layer on the second functional layer,
5) manufacturing a second electrode layer on the third functional layer.

In an embodiment of the present disclosure, the carrier transport material is an electron transport material, the first electrode layer is an ITO anode, the first function layer sequentially comprises a hole injection layer and a hole transport layer in a direction from the first electrode to the second electrode, the second function layer is an electron transport layer, the third function layer is an electron injection layer, and the second electrode layer is a metal cathode.

In an embodiment of the present disclosure, the carrier transport material is a hole transport material, the first electrode layer is a metal cathode, the first function layer sequentially comprises an electron injection layer and an electron transport layer in a direction from the first electrode to the second electrode, the second function layer is a hole transport layer, the third function layer is an hole injection layer, and the second electrode layer is an ITO anode.

How to manufacture a quantum dot ink suitable for ink-jet printing is a technical difficulty in this field. The inventors of the disclosure find that the quantum dot ink can be obtained by mixing a non-polar organic solvent, a surface tension modifier, a hydrophobic quantum dot, and a carrier transport material (e.g., an electron transport material or a hole transport material), and by adjusting a proportion of each component, the quantum dot ink suitable for ink-jet printing can be obtained. After completing ink-jet printing by using the quantum dot ink, phase separation occurs between the hydrophobic quantum dot and the carrier transport material. Thus, the two-layer structure of a hydrophobic quantum dot layer and a carrier transport material layer is formed in one process. Not only a quantum dot light emitting device is manufactured by the method of ink-jet printing, but also the operation is simplified, and the manufacturing cost of the quantum dot light emitting device is reduced.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1A:
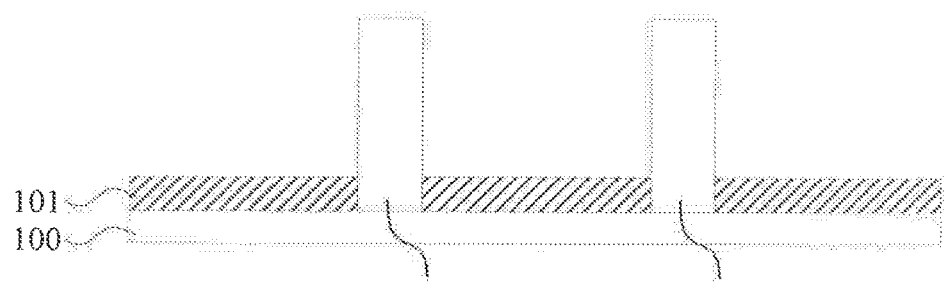
FIG. 1 (*a*)-(*e*) is a fabricating process diagram of the quantum dot light emitting device in an embodiment of the present disclosure.

Reference numerals: 100—substrate, 101—ITO anode, 102—pixel define layer 103—hole injection layer, 104—hole transport layer, 105—quantum dot ink, 1051—quantum dot light emitting layer, 1052 electron transport layer, 106 electron injection layer, 107—metal cathode, 200—substrate, 201—metal cathode, 202—pixel define layer, 203—electron injection layer, 204—electron transport layer, 2051—quantum dot light emitting layer, 2052—hole transport layer, 206—hole injection layer, 207—ITO anode.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly.

Unless otherwise defined, the percentage in the present disclosure is a mass percentage.

Unless otherwise defined, the chemical reagents and chemical substances used in the present disclosure are all commercially available products which are analytical or chemical pure.

In conventional quantum dot inks, generally a polymer is used as the carrier transport material. However, the polymer is easy to agglomerate with the quantum dot, and the viscosity and surface tension of conventional quantum dots are not suitable for using ink-jet printer to manufacture the electroluminescent device, the fact will greatly restrict the fabricating of the electroluminescent device by using the ink-jet printer. In the research, the inventors of the present disclosure are surprised to find that the quantum dot ink can be obtained by mixing a non-polar organic solvent, a surface tension modifier, a hydrophobic quantum dot, and a carrier transport material (e.g., an electron transport material or a hole transport material), and by adjusting a proportion of each component, the quantum dot ink suitable for ink-jet printing can be obtained. After completing ink-jet printing by using the quantum dot ink, phase separation occurs between the hydrophobic quantum dot and the carrier transport material. Thus, the two-layer structure of a hydrophobic quantum dot layer and a carrier transport material layer is formed in one process. Not only a quantum dot light emitting device is manufactured by a ink-jet printing method, but also the operation is simplified, and the manufacturing cost of the quantum dot light emitting device is reduced. Wherein, the hydrophobic quantum dot can be dispersed in the non-polar organic solvent, the surface tension scale of the quantum dot ink can be adjusted by the surface tension modifier, the light emitting layer of the quantum dot light-emitting device is formed by the hydrophobic quantum dot, the viscosity range of the quantum dot ink can be adjusted by the carrier transport material, and the carrier transport layer can be formed after the phase separation.

When the printing operation is carried out, a viscosity of the quantum dot ink is from 10 cP to 12 cP, and the surface tension of the quantum dot ink is from 32 dynes/cm to 42 dynes/cm, the viscosity and surface tension of the quantum dot ink are moderate, so that during ink jet printing, the quantum dot ink will not flow out from the ink-jet orifice, and it will not block the ink jet orifice, either, so as to better adapt to the ink-jet printing. It needs to explain that the measurements of the viscosity and surface tension are dependent to temperature. As long as under the temperature during ink jet printing, a viscosity of the quantum dot ink is from 10 cP to 12 cP, and a surface tension of the quantum dot ink is from 32 dynes/cm to 42 dynes/cm, a better printing effect can be obtained. In the following specific embodiments, the viscosity and surface tension are measured under a temperature, for example, 25° C., which is the most common operating temperature, and the present disclosure is not limited to this temperature.

In order to manufacture a quantum dot that can meet the above requirements of the viscosity and surface tension, the non-polar organic solvent is generally selected from an organic compound which is a liquid at room temperature 25° C. and has a boiling point less than 200° C. under normal pressure. The surface tension modifier is generally selected from a hydrophobic polar organic compound with a relative molecular mass less than 500, and the carrier transport material (i.e., an electron transport material or a hole transport material) is generally selected from an organic compound with a relative molecular mass less than 500. The non-polar organic solvent is selected from an organic compound which is a liquid at room temperature 25° C. and has a boiling point less than 200° C. under normal pressure, so that the hydrophobic quantum dot can be evenly dispersed. The surface tension modifier is generally selected from a hydrophobic and polar organic compound with a relative molecular mass less than 500, and the carrier transport material (i.e., an electron transport material or a hole transport material) is generally selected from an organic compound with a relative molecular mass less than 500, which can increase the solubility of the above substances and can reduce the risk of aggregation with the hydrophobic quantum dot to obtain a better printing effect.

First Embodiment

In the present embodiment, the quantum dot ink has the following components: oxadiazole (an electron transport material) 5 wt %, CdSe (a hydrophobic quantum dot) 2 wt %, octanoic acid (a surface tension modifier) 1 wt %, and n-hexane (a non-polar organic solvent) 92 wt %.

Each component is prepared according to the above mass ratio. First mixing the hydrophobic quantum dot CdSe with the non-polar organic solvent n-hexane evenly; then the electron transport material oxadiazole is added and mixed evenly; finally the surface tension modifier (octanoic acid) is added and mixed evenly. The above mentioned mixing methods include electromagnetic stirring, oscillation and/or ultrasonic dispersion. Mixing order is not limited to the above order, as long as a uniformly dispersed hydrophobic quantum dots mixture is obtained finally. After manufacturing the quantum dot ink, the viscosity of the quantum dot ink is 10 cp (25° C.) and its surface tension is 32 dynes/cm (25° C.) through measurement. The viscosity and surface tension can be measured by common methods of the field. For example, the viscosity can be measured by using a capillary viscometer, a rotary viscometer or a vibration viscometer, the surface tension can be measured by using a spinning drop interface tensiometer, a micro computerized surface tensiometer or a statics surface tensiometer. The measurement results of the viscosity and surface tension are mainly related to temperature, and less related to the measure methods and the test instrument. In the embodiment a digital rotary viscometer is used to measure the viscosity, the liquid to-be-measured is injected into the instrument, and then the measurement is started by clicking. In the embodiment a spinning drop interface tensiometer is used to measure the surface tension, the video optical system of the tensiometer is used to track the moving droplets, and a digital imaging system is used to the obtain the image, then the value of the surface tension is calculated by analysising and measuring the liquid drop images.

The hydrophobic quantum dot is generally manufactured in the high temperature oil phase method in an organic solvent, so the quantum dot having an organic ligand on the surface is obtained, the above organic ligand can be, for example, trioctylphosphine or trioctylphosphine, which is advantageous to the dispersion in the non-polar organic solvent. In addition, the surface of the hydrophobic quantum dot is electrically neutral, so the hydrophobic quantum dot and the electron transport material oxadiazole are not easy to agglomerate. Therefore, using the hydrophobic quantum dot and the non-polar organic solvent can solve the problem of dispersing the quantum dot into the quantum dot ink and the problem that the hydrophobic quantum dot and the electron transport material are easy to agglomerate. However, the inventors of the present disclosure find that only solving the above problems is not enough, the viscosity and surface tension of the quantum dot ink need to meet a certain requirements so that it is suitable for the manufacture of the quantum dot light emitting device during ink-jet printing. For example, if the viscosity of the quantum dot ink is too low or its surface tension is too small, ink drops will not be formed, as a result, a liquid flow is directly formed and flow out from the ink jet orifice, which makes it impossible to print; if the viscosity of the quantum dot ink is too high or its surface tension is too big, the ink will block the ink-jet orifice of the printer, which makes it impossible to print; The main object of the surface tension modifier octanoic acid is to increase the surface tension of the quantum dot ink and to make it suitable for ink jet printing. The inventors of the disclosure find that the proportion ranges of the hydrophobic quantum dot, the carrier transport material, the surface tension modifier and the non-polar organic solvent can be adjusted appropriately so that the viscosity of the quantum dot ink is from 10 cP to 12 cP and its surface tension is from 32 dynes/cm to 42 dynes/cm, in other words, can better adapt to the requirements of inkjet printing.

The hydrophobic quantum dot used in this embodiment is a CdSe quantum dot. However, the selection of the quantum dot is not limited to this, any existing quantum dots can be used in this field. For example, the quantum dot can be one or the combinations of the following substances, i.e., CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe and AlSb.

The electron transport material used in this embodiment is oxadiazole. However, the selection of the electron transport material is not limited to this; any existing quantum dots in this field can meet the requirement as long as it is an organic with a relative molecular mass less than 500. The relative molecular mass larger than 500 will reduce the solubility of the above substances and increase the risk of agglomeration. For example, the electron transport material can be selected from one or more of the group consisting of: oxadiazole, Thiadiazole, S-Triazole, Naphthaline, Benzoquinone, Carbazole and the derivatives of the above substances.

The non-polar organic solvent used in this embodiment is n-hexane. However, the selection of the electron transport material is not limited to this, any existing non-polar organic solvents in this field can meet the requirement as long as the non-polar organic solvent is a liquid at 25° C., and its boiling point is less than 200° C. under normal pressure. The so called non-polar organic solvent is a class of solvents with a low dielectric constant. But the present disclosure is not limited to the above range of the dielectric constant, any range of the dielectric constant can meet the requirement as long as the hydrophobic quantum dot can be dispersed in the non-polar organic solvent in the used range, and it can be stably stored for more than one week, one month, or three months. For example, the non-polar organic solvent can be selected from one of chain alkanes, cycloalkanes, halogenated hydrocarbon, aromatic hydrocarbon, derivatives of these substances or combinations thereof. Another example, the non-polar organic solvent can be selected from one of n-pentane, n-hexane, n-heptane, n-octane, cyclopentane, cyclohexane, chloroform, ethyl bromide, carbon tetrachloride, benzene, toluene and combinations thereof. By selecting a particular solvent from the above non-polar solvents, the hydrophobic quantum dot can be better dispersed and a more stable quantum dot ink can be formed.

The surface tension modifier used in the embodiment is octanoic acid. However, the selection of the surface tension modifier is not limited to this, any hydrophobic polar organic with a relative molecular mass less than 500 can meet the requirements. Hydrophobicity ensures that it is mutually soluble with the non-polar solvent, polarity ensures that it can increase the surface tension of the quantum dot ink, and the relative molecular mass greater than 500 will reduce its solubility and increase the risk of agglomeration. For example, the surface tension modifier may be an organic acid, an organic ammonia or a mixture thereof. Another example, the surface tension modifier may be a fatty acid, an alkyl amine or a mixture thereof. Another example, the surface tension modifier may be one of the following substances or mixture thereof: octanoic acid, decanoic acid, oleic acid and lauric acid; and the alkyl amine is a laurylamine, a hexadecylamine, an octadecylamine, an oleylamine or a mixture thereof. By selecting the specific surface tension modifier, the surface tension of the quantum dot ink can be better adjusted to the appropriate range, thus better adapt to the requirements of ink-jet printing.

In the following, a manufacture method of a quantum dot light emitting device through printing the above quantum dot ink is described according to FIG. 1.

As shown in FIG. 1a, first an ITO anode 101 and a pixel define layer 102 are manufactured on the substrate 100. The anode 101 is a pixel electrode, as shown in FIG. 1a, generally three separated pixel electrodes are set, and different pixel electrodes generally emit light of different colors. For example, in a full color display, the three separated pixel electrodes emit red light, green light and blue light respectively.

Figure 1B:
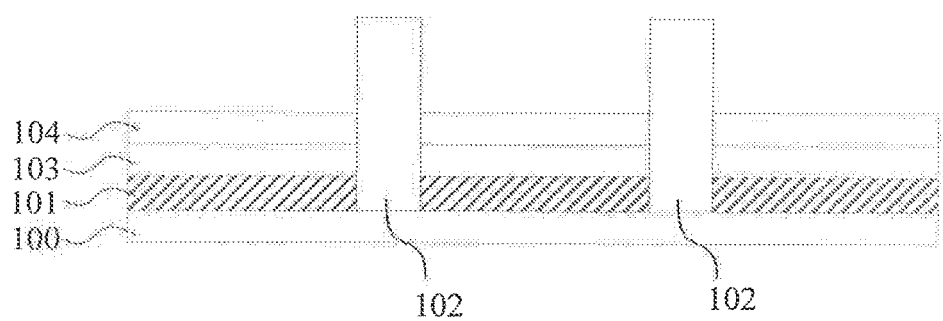

Then, as shown in FIG. 1b, a hole injection layer 103 and a hole transport layer 104 are manufactured on the ITO anode 101.

Figure 1C:
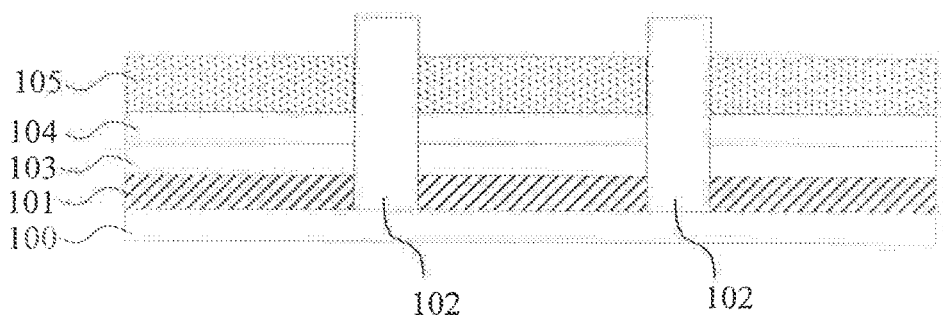

As shown in FIG. 1c, an ink-jet printer is used to print a layer of the quantum dot ink 105 on the hole transport layer 104.

Figure 1D:
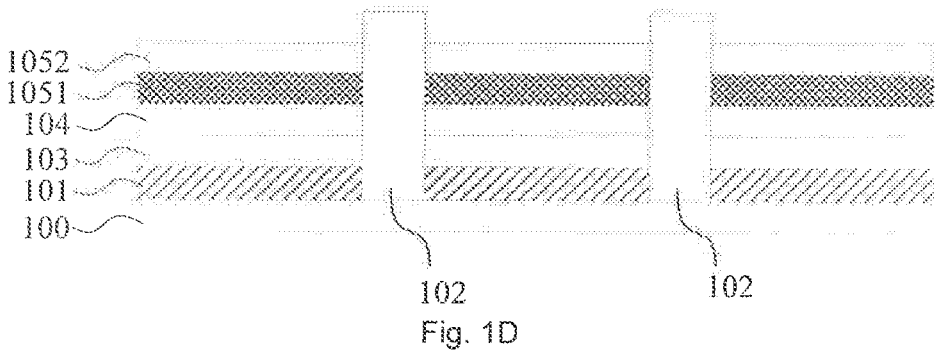

As shown in FIG. 1d, after completing printing the quantum dot ink 105, it is dryed in vacuum or by heating. In this process, phase separation occurs between the hydrophobic quantum dot and the electron transport material, the hydrophobic quantum dot is in the lower layer to form a quantum dot light emitting layer 1051; the electron transport material is in the upper layer to form the electron transport layer 1052, thus a two-layer structure is obtained in one printing process. As mentioned above, the surface tension and viscosity of the quantum dot ink can be controlled by adjusting the proportion of each component in the quantum dot ink (the viscosity of the quantum dot ink in the embodiment is 10 cp (25° C.) and its surface tension is 32 dynes/cm), the thickness of the electron transport layer and the thickness of the quantum dot light emitting layer can be controlled. In the embodiment, the thickness of the above electron transport layer 1052 obtained by printing is 5 nm; the thickness of the quantum dot light emitting layer 1051 is 8 nm.

Figure 1E:
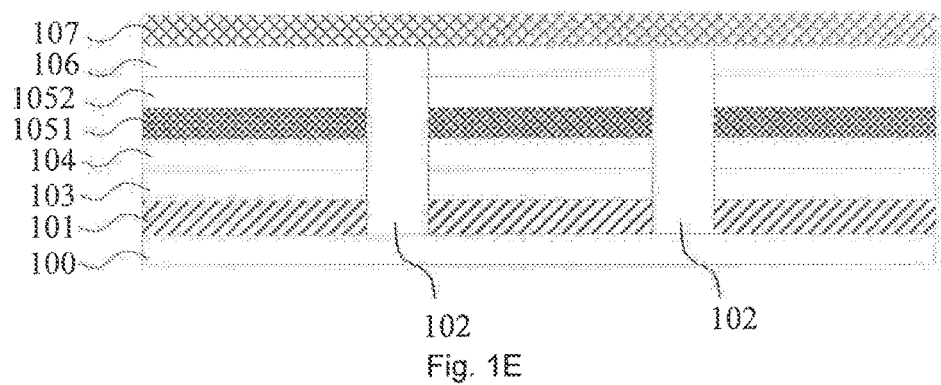

As shown in FIG. 1e, an electron injection layer 106 and a metal cathode 107 are manufactured on the electron transport layer 1052 to complete the manufacture of the device.

In the manufacture of the above layers, the ITO anode is generally manufactured by the sputtering method, the metal cathode is generally prepared by the vacuum evaporation, and the other layers can be manufactured by ink-jet printing.

Second Embodiment

In the present embodiment, the quantum dot ink has the following components: CBP (4,4'-Bis(N-carbazolyl)-1,1'-biphenyl) (a hole transport material) 5 wt %; a hydrophobic quantum dot (CdSc) 2 wt %; octanoic acid (a surface tension modifier) 1 wt % and a non-polar organic solvent (n-hexane) 92 wt %. Technical contents which are the same with the first embodiment will not be repeated, similarly hereinafter.

Different from the above embodiment, the hole transport material is used to replace the electron transport material. Thus, the manufacture order of each layer in the quantum dot light emitting device needs to be reversed.

In the following, a manufacture method of a quantum dot light emitting device through printing the above quantum dot ink is described in accordance with FIG. 2.

Figure 2:
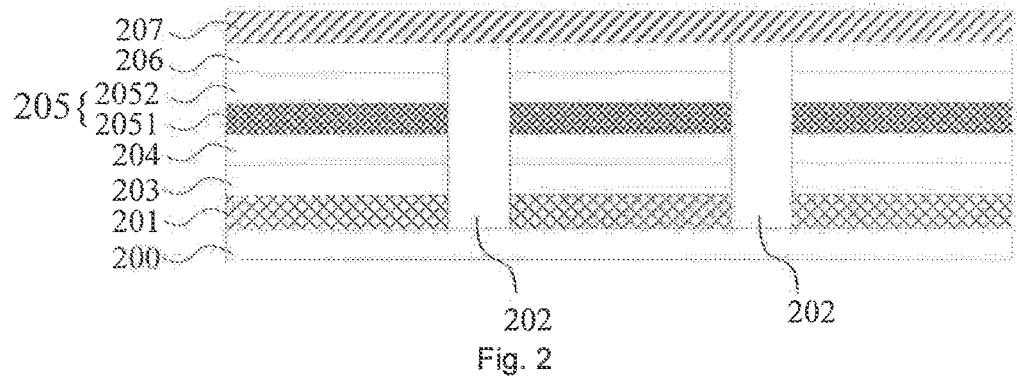
FIG. 2 is a schematic structure diagram of a quantum dot light emitting device in another embodiment of the present disclosure.

As shown in FIG. 2, firstly a metal cathode 201 and a pixel define layer 202 are manufactured on the substrate 200.

Then, an electron injection layer 203 and an electron transport layer 204 are manufactured on the metal cathode 201.

Then, an ink-jet printer is used to print a layer of the quantum dot ink 205 on the hole transport layer 204 (FIG. 2 shows a condition after the phase separation).

After completing printing the quantum dot ink 205, drying it by vacuum or heat. In this process, phase separation occurs between the hydrophobic quantum dot and the electron transport material. The hydrophobic quantum dot is in the lower layer to form a quantum dot light-emitting layer 2051; the hole transport material is in the upper layer to form the hole transport layer 2052, thus the two-layer structure is obtained for in one printing process. As mentioned above, the surface tension and viscosity of the quantum dot ink can be controlled by adjusting the proportion of each component in the quantum dot ink (the viscosity of the quantum dot ink in the embodiment is 10 cp (25° C.) and its surface tension is 32 dynes/cm), the thickness of the electron transport layer and the thickness of the quantum dot light emitting layer can be controlled. In the embodiment, the thickness of the above printed electron transport layer 2052 is 5 nm; the thickness of the quantum dot light emitting layer 2051 is 8 nm.

Finally, a hole injection layer 206 and an ITO anode 207 are manufactured on the electron transport layer 2052 to complete the manufacture of the device.

Third Embodiment

In the present embodiment, the quantum dot ink has the following components: oxadiazole (an electron transport material) 5 wt %, a hydrophobic quantum dot (ZnO) 20 wt %, octadecylamine (a surface tension modifier) 1 wt % and a non-polar organic solvent (n-hexane) 74 wt %. The quantum dot ink is manufactured in the same method as the first embodiment. The viscosity of the quantum dot ink is 10.5 cp (25° C.) and its surface tension is 33 dynes/cm (25° C.) through measurement.

A quantum dot light emitting device is manufactured according to the manufacture method of the quantum dot light emitting device in the first embodiment, in which a thickness of the electron transport layer is 5 nm; a thickness of the quantum dot layer is 15 nm.

Fourth Embodiment

In the present embodiment, the quantum dot ink has the following components: S-Triazole (an electron transport material) 5 wt %; a hydrophobic quantum dot (GaAs) 20 wt %; oleylamine (a surface tension modifier) 20 wt % and a non-polar organic solvent (benzene) 55 wt %. The quantum dot ink is manufactured in the same method in the first embodiment. The viscosity of the quantum dot ink is 10 cp (25° C.) and the surface tension of the quantum dot ink is 38 dynes/cm (25° C.) through measurement.

A quantum dot light emitting device is manufactured according to the manufacture method in the first embodiment, in which a thickness of the electron transport layer is 5 nm; a thickness of the quantum dot layer is 15 nm.

Fifth Embodiment

In the present embodiment, the quantum dot ink has the following components: Carbazole (an electron transport material) 15 wt %; a hydrophobic quantum dot (InP) 2 wt %; oil acid (a surface tension modifier) 1 wt % and a non-polar organic solvent (benzene) 82 wt %. The quantum dot ink is manufactured in the same method in the first embodiment. The viscosity of the quantum dot ink is 11.5 cp (25° C.) and the surface tension of the quantum dot ink is 35 dynes/cm (25° C.) through measurement.

A quantum dot light emitting device is manufactured according to the manufacture method in the first embodiment, in which a thickness of the electron transport layer is 45 nm; the thickness of the quantum dot layer is 10 nm.

Sixth Embodiment

In the present embodiment, the quantum dot ink has the following components: Carbazole (an electron transport material) 15 wt %; a hydrophobic quantum dot (ZnS) 20 wt %; oil acid (a surface tension modifier) 1 wt % and a non-polar organic solvent (benzene) 64 wt %. The quantum dot ink is manufactured in the same method in the first embodiment. The viscosity of the quantum dot ink is 11.5 cp (25° C.) and the surface tension of the quantum dot ink is 35 dynes/cm (25° C.) through measurement.

A quantum dot light emitting device is manufactured according to the manufacture method in the first embodiment, in which a thickness of the electron transport layer is 45 nm; a thickness of the quantum dot layer is 28 nm.

Seventh Embodiment

In the present embodiment, the quantum dot ink has the following components: Naphthaline (an electron transport material) 15 wt %; a hydrophobic quantum dot (GaAs) 20 wt %; decanoic acid (a surface tension modifier) 5 wt % and a non-polar organic solvent (carbon tetrachloride) 60 wt %. The quantum dot ink is manufactured in the same method in the first embodiment. The viscosity of the quantum dot ink is 12 cp (25° C.) and its surface tension is 42 dynes/cm (25° C.) through measurement.

A quantum dot light emitting device is manufactured according to the manufacture method of the quantum dot light emitting device in the first embodiment, in which a thickness of the electron transport layer is 50 nm; a thickness of the quantum dot layer is 40 nm.

Eighth Embodiment

In the present embodiment, the quantum dot ink has the following components: Oxadiazole (an electron transport material) 10 wt %; a hydrophobic quantum dot (CdSe) 15 wt %; octanoic acid (a surface tension modifier) 1.5 wt % and a non-polar organic solvent (n-hexane) 73.5 wt %. The quantum dot ink is manufactured in the same method in the first embodiment. The viscosity of the quantum dot ink is II cp (25° C.) and the surface tension of the quantum dot ink is 38 dynes/cm (25° C.) through measurement.

A quantum dot light emitting device is manufactured according to the manufacture method in the first embodiment, in which a thickness of the electron transport layer is 30 nm; a thickness of the quantum dot layer is 28 nm.

Ninth Embodiment

In the present embodiment, the quantum dot ink has the following components: S-Triazole (an electron transport material) 8 wt %; a hydrophobic quantum dot (GaAs) 5 wt %; decanoic acid (a surface tension modifier) 2 wt % and a non-polar organic solvent (n-pentane) 85 wt %. The quantum dot ink is manufactured in the same method in the first embodiment. The viscosity of the quantum dot ink is 11.5 cp (25° C.) and the surface tension of the quantum dot ink is 40 dynes/cm (25° C.) through measurement.

A quantum dot light emitting device is manufactured according to the manufacture method in the first embodiment, in which a thickness of the electron transport layer is 25 nm; the thickness of the quantum dot layer is 15 nm.

Tenth Embodiment

In the present embodiment, the quantum dot ink has the following components: Oxadiazole (an electron transport material) 12 wt %; a hydrophobic quantum dot (CdSe) 18 wt %; lauric acid (a surface tension modifier) 4 wt % and a non-polar organic solvent (carbon tetrachloride) 66 wt %. The quantum dot ink is manufactured in the same method in the first embodiment. The viscosity of the quantum dot ink is 12 cp (25° C.) and the surface tension of the quantum dot ink is 41 dynes/cm (25° C.) through measurement.

A quantum dot light emitting device is manufactured according to the manufacture method in the first embodiment, in which a thickness of the electron transport layer is 30 nm; a thickness of the quantum dot layer is 20 nm.

Eleventh Embodiment

In the present embodiment, the quantum dot ink has the following components: Benzoquinone (an electron transport material) 9 wt %; a hydrophobic quantum dot (CdSe) 10 wt %; octanoic acid (a surface tension modifier) 2 wt % and a non-polar organic solvent (n-hexane) 79 wt %. The quantum dot ink is manufactured in the same method in the first embodiment. The viscosity of the quantum dot ink is 11 cp (25° C.) and the surface tension of the quantum dot ink is 39 dynes/cm (25° C.) through measurement.

A quantum dot light emitting device is manufactured according to the manufacture method in the first embodiment, in which a thickness of the electron transport layer is 25 nm; a thickness of the quantum dot layer is 17 nm.

Twelfth Embodiment

In the present embodiment, the quantum dot ink has the following components: Naphthaline (an electron transport material) 11 wt %; a hydrophobic quantum dot (ZnS) 13 wt %; laurylamine (a surface tension modifier) 1.5 wt % and a non-polar organic solvent (cyclohexane) 74.5 wt %. The quantum dot ink is manufactured in the same method in the first embodiment. The viscosity of the quantum dot ink is 10.5 cp (25° C.) and the surface tension of the quantum dot ink is 36 dynes/cm (25° C.) through measurement.

A quantum dot light emitting device is manufactured according to the manufacture method in the first embodiment, in which a thickness of the electron transport layer is 28 nm; a thickness of the quantum dot layer is 19 nm.

Thirteenth Embodiment

In the present embodiment, the quantum dot ink has the following components: a-NPD (N'-diphenyl-N,N'-bis(1-naphthyl)-(1,1'-biphenyl)-4,4"-diamine) (an electron transport material) 8 wt %; a hydrophobic quantum dot (GaAs) 5 wt %; decanoic acid (a surface tension modifier) 2 wt % and a non-polar organic solvent (n-pentane) 85 wt %. The quantum dot ink is manufactured in the same method in the second embodiment. The viscosity of the quantum dot ink is 11.5 cp (25° C.) and the surface tension of the quantum dot ink is 40 dynes/cm (25° C.) through measurement.

A quantum dot light emitting device is manufactured according to the manufacture method in the second embodiment, in which a thickness of the electron transport layer is 25 nm; a thickness of the quantum dot layer is 15 nm.

Fourteenth Embodiment

In the present embodiment, the quantum dot ink has the following components: TCCA (4,4',4"-Tris(N-pyrazolyl)-triphenylamine) (an electron transport material) 12 wt %; a hydrophobic quantum dot (CdSe) 18 wt %; lauric acid (a surface tension modifier) 4 wt % and a non-polar organic solvent (n-hexane) 66 wt %. The quantum dot ink is manufactured in the same method in the second embodiment. The viscosity of the quantum dot ink is 12 cp (25° C.) and the surface tension of the quantum dot ink is 41 dynes/cm (25° C.) through measurement.

A quantum dot light emitting device is manufactured according to the manufacture method in the second embodiment, in which a thickness of the electron transport layer is 30 nm; the thickness of the quantum dot layer is 20 nm.

Fifteenth Embodiment

In the present embodiment, the quantum dot ink has the following components: DNTPD (N,N'-bis(4-(N,N'-biphenyl-amide) phenyl)-N,N'-Diphenylbenzidine) (an electron transport material) 9 wt %; a hydrophobic quantum dot (CdSe) 10 wt %; octanoic acid (a surface tension modifier) 2 wt % and a non-polar organic solvent (n-heptane) 79 wt %. The quantum dot ink is manufactured in the same method in the second embodiment. The viscosity of the quantum dot ink is 11 cp (25° C.) and the surface tension of the quantum dot ink is 39 dynes/cm (25° C.) through measurement.

A quantum dot light emitting device is manufactured according to the manufacture method in the second embodiment, in which a thickness of the electron transport layer is 25 nm; a thickness of the quantum dot layer is 17 nm.

Sixteenth Embodiment

In the present embodiment, the quantum dot ink has the following components: a-NPD (N'-diphenyl-N,N'-bis(1-naphthyl)-(1,1'-biphenyl)-4,4"-diamine) (an electron transport material) 11 wt %; a hydrophobic quantum dot (ZnS) 13 wt %; laurylamine (a surface tension modifier) 1.5 wt % and a non-polar organic solvent (n-pentane) 74.5 wt %. The quantum dot ink is manufactured in the same method in the second embodiment. The viscosity of the quantum dot ink is 10.5 cp (25° C.) and the surface tension of the quantum dot ink is 36 dynes/cm (25° C.) through measurement.

A quantum dot light emitting device is manufactured according to the manufacture method in the second embodiment, in which a thickness of the electron transport layer is 28 nm; the thickness of the quantum dot layer is 19 nm.

The above are only the model implementation ways of the present disclosure, and not used to limit the scope of protection of the present disclosure, the scope of protection of the present disclosure is determined by the attached claims.

The present application claims the priority of the Chinese Patent Application No. 201510431537.8 filed on Jul. 21, 2015, which is incorporated herein by reference as part of the disclosure of the present application.

What is claimed is:

1. A quantum dot ink, comprising a non-polar organic solvent, a surface tension modifier and a hydrophobic quantum dot,
    wherein the quantum dot ink further comprises a carrier transport material, and phase separation is present between the hydrophobic quantum dot and the carrier transport material;
    a viscosity of the quantum dot ink is from 10 cP to 12 cP, and a surface tension of the quantum dot ink is from 32 dynes/cm to 42 dynes/cm;
    a mass percentage of each component in the quantum dot ink is: 5%-15% carrier transport material, 1%-5% surface tension modifier, 2%-20% hydrophobic quantum dot and 60%-92% non-polar organic solvent,
    the surface tension modifier is an organic acid, an organic ammonia or a mixture thereof.

2. The quantum dot ink according to claim 1, wherein the surface tension modifier is a hydrophobic and polar organic compound with a relative molecular mass less than 500.

3. The quantum dot ink according to claim 1, wherein the carrier transport material is an electron transport material or a hole transport material with a relative molecular mass less than 500.

4. The quantum dot ink according to claim 1, wherein the non-polar organic solvent is a liquid at 25° C., and the boiling point is less than 200° C. under normal pressure.

5. The quantum dot ink according to claim 1, wherein a material of the hydrophobic quantum dot is one or more selected from the group consisting of: CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe and AlSb.

6. The quantum dot ink according to claim 1, wherein the carrier transport material is an electron transport material, and the electron transport material is selected from the group consisting of: Oxadiazole, Thiadiazole, S-Triazole, Naphthaline, Benzoquinone, Carbazole, derivatives of the above substances and combinations thereof.

7. The quantum dot ink according to claim 1, wherein the carrier transport material is a hole transport material, and the hole transport material is selected from the group consisting of: CBP (4,4'-Bis(N-carbazolyl)-1,1'-biphenyl), a-NPD (N'-diphenyl-N,N'-bis(1-naphthyl)-(1,1'-biphenyl)-4,4"-diamine), TCCA (4,4',4"-Tris(N-pyrazolyl)-triphenylamine), DNTPD(N,N'-bis(4-(N,N'-biphenyl-amide) phenyl)-N,N'-Diphenylbenzidine) and combinations thereof.

8. The quantum dot ink according to claim 1, wherein the organic acid is a fatty acid, and the organic ammonia is an alkyl ammonia.

9. The quantum dot ink according to claim 8, wherein the fatty acid is selected from the group consisting of octanoic acid, decanoic acid, oleic acid, lauric acid and combinations thereof.

10. The quantum dot ink according to claim 8, wherein the alkyl ammonia is selected from the group consisting of laurylamine, hexadecylamine, octadecylamine, oleylamine and combinations thereof.

11. The quantum dot ink according to claim 1, wherein the non-polar organic solvent is selected from the group consisting of chain alkanes, cycloalkanes, halogenated hydrocarbon, aromatic hydrocarbon, derivatives of these substances and combinations thereof.

12. The quantum dot ink according claim 11, wherein the non-polar organic solvent is selected from the group consisting of n-pentane, n-hexane, n-heptane, n-octane, cyclopentane, cyclohexane, chloroform, ethyl bromide, carbon tetrachloride, benzene, toluene and combinations thereof.

13. The quantum dot ink according to claim 1, wherein a mass percentage of each component in the quantum dot ink is: 8%-12% carrier transport material, 1%-5% surface tension modifier, 5%-18% hydrophobic quantum dot, and 66%-86% non-polar organic solvent.

14. The quantum dot ink according to claim 1, wherein a mass percentage of each component is: 9%-11% carrier transport material, 1%-2% surface tension modifier, 10%-15% hydrophobic quantum dot, and 62%-80% non-polar organic solvent.

15. The quantum dot ink according to claim 1, wherein a surface of the hydrophobic quantum dot comprises a trioctylphosphine ligand or a trioctylphosphine oxide ligand.

16. A fabricating method of a quantum dot ink, comprising:
mixing a hydrophobic quantum dot, a carrier transport material, a surface tension modifier and a non-polar organic solvent to obtain a quantum dot ink;
wherein a proportion of each component is adjusted to allow phase separation to happen between the hydrophobic quantum dot and the carrier transport material;
a viscosity of the quantum dot ink is from 10 cP to 12 cP, and the surface tension of the quantum dot ink is from 32 dynes/cm to 42 dynes/cm;
a mass percentage of each component in the quantum dot ink is: 5%-15% carrier transport material, 1%-5% surface tension modifier, 2%-20% hydrophobic quantum dot and 60%-92% non-polar organic solvent,
the surface tension modifier is an organic acid, and organic ammonia or a mixture thereof.

* * * * *